United States Patent
Lee et al.

(10) Patent No.: US 9,983,249 B2
(45) Date of Patent: May 29, 2018

(54) METHOD FOR DETECTING GROUND FAULT IN INVERTER INCLUDING SHUNT RESISTORS

(71) Applicant: LSIS CO., LTD., Anyang-si, Gyeonggi-do (KR)

(72) Inventors: Jaemoon Lee, Anyang-si (KR); Chunsuk Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 67 days.

(21) Appl. No.: 15/063,220

(22) Filed: Mar. 7, 2016

(65) Prior Publication Data
US 2016/0299184 A1    Oct. 13, 2016

(30) Foreign Application Priority Data
Apr. 9, 2015 (KR) .................... 10-2015-0050090

(51) Int. Cl.
| | | |
|---|---|---|
| *G01R 31/14* | (2006.01) | |
| *G01R 31/02* | (2006.01) | |
| *B60L 3/00* | (2006.01) | |
| *G01R 31/34* | (2006.01) | |
| *H02P 29/024* | (2016.01) | |

(52) U.S. Cl.
CPC .......... *G01R 31/025* (2013.01); *B60L 3/0069* (2013.01); *G01R 31/343* (2013.01); *H02P 29/0241* (2016.02)

(58) Field of Classification Search
CPC .. G01R 31/025; G01R 31/005; G01R 31/088; G01R 31/343; G01R 31/086; G01R 31/12; G01R 31/346; G01R 31/42; H02H 3/165; H02H 7/1216; H02H 7/1227; H02H 3/027; H02H 3/16; H02H 7/0833; H02M 1/32; H02M 7/487; H02P 29/024
See application file for complete search history.

(56) References Cited

U.S. PATENT DOCUMENTS

| | | | | |
|---|---|---|---|---|
| 4,870,527 A | * | 9/1989 | Zaleski ............... | H02H 7/1216 361/44 |
| 5,214,575 A | * | 5/1993 | Sugishima .......... | H02H 7/1216 361/42 |

(Continued)

FOREIGN PATENT DOCUMENTS

| | | |
|---|---|---|
| CN | 102480245 | 5/2012 |
| EP | 0490388 | 6/1992 |

(Continued)

OTHER PUBLICATIONS

Search Report dated Jul. 2, 2015 prepared by the Korean Intellectual Property Solutions Cop, 6 pages.

(Continued)

*Primary Examiner* — Vinh Nguyen
(74) *Attorney, Agent, or Firm* — K&L Gates LLP

(57) ABSTRACT

A method for detecting a ground fault in an inverter using leg-shunt resistors is provided. The method includes detecting output currents of three phases of the inverter, determining whether or not a voltage utilization of the inverter is not less than a preset allowable voltage level, and determining an occurrence or non-occurrence of the ground fault in the inverter.

10 Claims, 9 Drawing Sheets

(56) References Cited

U.S. PATENT DOCUMENTS

| | | | | |
|---|---|---|---|---|
| 5,768,079 A * | 6/1998 | Buell | ............... | H02H 3/006 361/76 |
| 2005/0099743 A1* | 5/2005 | Lee | ............... | H02H 3/027 361/42 |
| 2013/0293988 A1 | 11/2013 | Li et al. | | |

FOREIGN PATENT DOCUMENTS

| | | |
|---|---|---|
| JP | H06351280 | 12/1994 |
| JP | 2002238299 | 8/2002 |
| JP | 2008048504 | 2/2008 |
| JP | 2010279125 | 12/2010 |
| JP | 2012157103 | 8/2012 |
| KR | 101202949 | 11/2012 |

OTHER PUBLICATIONS

Japan Patent Office Application No. 2016-054996, Office Action dated Mar. 7, 2017, 2 pages.
European Patent Office Application Serial No. 16159321.5, Search Report dated Sep. 7, 2016, 58 pages.

* cited by examiner

| SECTOR INFORMATION | Iu | Iv | Iw |
|---|---|---|---|
| 1 | Iu=(Ivs+Iws) | Iv=-Ivs | Iw=-Iws |
| 2 | Iu=-Ius | Iv=(Ius+Iws) | Iw=-Iws |
| 3 | Iu=-Ius | Iv=(Ius+Iws) | Iw=-Iws |
| 4 | Iu=-Ius | Iv=-Ivs | Iw=(Ius+Ivs) |
| 5 | Iu=-Ius | Iv=-Ivs | Iw=(Ius+Ivs) |
| 6 | Iu=(Ivs+Iws) | Iv=-Ivs | Iw=-Iws |

METHOD FOR DETECTING GROUND FAULT IN INVERTER INCLUDING SHUNT RESISTORS

CROSS-REFERENCE TO RELATED APPLICATION

Pursuant to 35 U.S.C. § 119(a), this application claims the benefit of earlier filing date and right of priority to Korean Application No. 10-2015-0050090, filed on Apr. 9, 2015, the contents of which is incorporated by reference herein in its entirety.

BACKGROUND OF THE INVENTION

1. Field of the Invention

This disclosure relates to a method for detecting a ground fault in an inverter, and more particularly, a method for detecting a ground fault occurring of output of an inverter, which employs a method of detecting a current in an inverter using leg-shunt resistors.

2. Background of the Invention

A converter (in other words a three-phases rectifier) converts an alternating current (abbreviated as AC hereinafter) voltage into a direct-current (abbreviated as DC hereinafter) voltage, and an inverter switches the DC voltage converted in the converter according to a pulse width modulation (abbreviated as PWM hereinafter) signal so as to generate an AC voltage. As illustrated in FIG. 1, the AC voltage generated in the inverter is transferred to an electric load, such as a motor.

A ground fault may occur on an output side of the inverter due to a disconnection of an output line of the inverter, an unexpected connection of a conductor between an output of the inverter and a ground. When the ground fault occurs, a motor may be damaged due to deterioration which results from an overcurrent exceeding a rated current. When a ground fault path is brought into contact with a human body, it may arouse an accident involved in a human life. Therefore, an inverter for driving a motor provides functions of notifying a user of an occurrence of the ground fault and safely protecting the motor and the user by stopping its operation upon the occurrence of the ground fault.

Typically, an occurrence or non-occurrence of phase deficiency and ground fault on the output side of the inverter is determined based upon detected output currents of the inverter.

As illustrated in FIG. 2A, during a normal operation of the inverter, a sum of output currents of three phases which are output from the inverter is zero (0) (i.e., $Iu+Iv+Iw=0$) according to a Kirchhoff Current Law (abbreviated as KCL hereinafter).

However, as illustrated in FIG. 2B, when a ground fault occurs on a w-phase, a current of the w-phase on which the ground fault has occurred flows to the ground so as to become a ground fault current Ig. Therefore, the sum of the three-phases output currents is not zero (i.e., $Iu+Iv+Iw\neq0$). In this manner, the occurrence or non-occurrence of the phase deficiency and the ground fault on the output side of the inverter can be determined using the output current values of the three phases of the inverter. The sum of the three-phase currents may be detected by installing a zero phase current transformer (abbreviated as ZCT) commonly on the output lines of the three phases of the inverter.

Referring to FIG. 3, in an output current detection circuit of an inverter using current transformers (abbreviated as CT hereinafter) according to the related art, the CTs are installed on output lines of the respective phases to detect the three-phase output currents. The current detection method using the CTs is generally employed in a standard inverter or higher level inverters. In the related art method of detecting the phase deficiency in the inverter which detects currents using the CTs, as aforementioned, the occurrence or non-occurrence of the ground fault on the output line of the inverter is determined using the three-phases output currents according to the KCL. For example, during the normal operation of the inverter, the sum of the output currents of the three phases which are output from the inverter is zero (0) (i.e., $Iu+Iv+Iw=0$) according to the KCL. However, when the ground fault occurs, the sum of the three-phase output currents is not zero (i.e., $Iu+Iv+Iw\neq0$). That is, in the detection of the ground fault on the output line of the inverter, when the sum of the three-phase output currents obtained according to the KCL is not less than a preset level, it may be determined that the ground fault has occurred and accordingly a protection operation is carried out. A flowchart of the method of detecting the ground fault on the output line of the inverter according to the related art is illustrated in FIG. 4.

As aforementioned, the method of detecting the ground fault by applying the KCL to the three-phase output currents of the inverter may be usefully applied to the inverter which detects the currents using the CTs.

However, the aforementioned method cannot be applied to detect a ground fault on output side of an inverter, which employs a method of detecting currents using leg-shunt resistors as illustrated in FIG. 5.

Hereinafter, a method of detecting currents using leg-shunt resistors will be described with reference to FIG. 5.

Leg-shunt resistors R1, R2 and R3 are disposed at emitter (E) terminals of insulated-gate bipolar transistor (abbreviated as IGBT hereinafter), which are located at lower ends of the phases of the inverter, respectively, to detect output currents of the inverter when currents flow to the lower IGBTs according to a switching operation state of the inverter.

In the detection of the output currents of the inverter using the leg-shunt resistors R1, R2 and R3, as illustrated in FIG. 6, a current detection region is limited according to a switching operation state and a current flowing time of the inverter. Therefore, in order to extend the current detection region, the current detection may be implemented in a manner of detecting output currents of two available phases of the three phases and calculating a current of the remaining one phase based on the detected two-phase output currents. FIG. 6 illustrates output current detection limit regions according to PWM states of the inverter, and FIG. 7 illustrates a table including Formulas for detecting output currents of two available phases among the three phases of the inverter and calculating an output current of the remaining one phase.

That is, in the method of detecting the output currents in the inverter using the leg-shunt resistors, currents of two available phases among the three phases whose switching elements are turned on according to PWM control signals are detected and a current of the other phase is calculated based on the detected currents. Therefore, during the normal operation of the inverter and upon the occurrence of the ground fault, the sum of the output currents on the three phases is always zero (i.e., $Iu+Iv+Iw=0$). Consequently, the related art ground fault detection method for detecting the ground fault of the inverter cannot be applied to the inverter in which the current detection is performed using the leg-shunt resistors.

The current detection using the leg-shunt resistors can be implemented with relatively lower costs than the current detection using the CTs, and thus is widely used for a low-priced small inverter. Considering this, a method of detecting a ground fault in an inverter accurately and fast, which can be applied to the current detection using the leg-shunt resistors, is required.

SUMMARY OF THE INVENTION

Therefore, an aspect of the this disclosure is to solve the problems and other drawbacks of the related art. An object of the this invention is to provide a method for detecting a ground fault in an inverter in an accurate and fast manner, which can be applied to a current detection using leg-shunt resistors.

To achieve these and other advantages and in accordance with the purpose of this disclosure, as embodied and broadly described herein, there is provided a method for detecting a ground fault on an output line of an inverter using leg-shunt resistors, the method comprising:

detecting output currents for three phases of the inverter;

determining whether or not a voltage utilization of the inverter is less than a preset allowable voltage level; and determining an occurrence or non-occurrence of the ground fault on the inverter.

According to a preferred aspect of the invention, the method according to the invention further comprises a step of determining whether or not an output current level of the inverter is less than a preset allowable current level when it is determined that the voltage utilization is not less than the preset allowable voltage level.

According to another preferred aspect of the invention, the method according to the invention further comprises a step of applying a zero vector through a pulse-width modulation, and sampling output currents within a zero vector zone, when it is determined that the output current level of the inverter is not less than the preset allowable current level.

According to still another preferred aspect of the invention, in the method according to the invention, the occurrence or non-occurrence of the ground fault of the inverter is determined using the sampled output currents, after sampling the output currents within the zero vector zone.

According to still another preferred aspect of the invention, in the method according to the invention, it is determined that the ground fault has occurred and a protection operation is executed accordingly when a sum of the sampled output currents of the inverter is not less than a preset output ground fault level.

According to still another preferred aspect of the invention, in the method according to the invention, it is determined that the ground fault has occurred and a protection operation is executed accordingly, at the step of determining the occurrence or non-occurrence of the ground fault of the inverter, when a sum of the detected three-phase output currents is not less than a preset ground fault level, after it is determined that the voltage utilization is lower than the preset allowable voltage level.

According to still another preferred aspect of the invention, in the method according to the invention, the method is fed back to the step of detecting the output currents of the three phases when it is determined that the output current level of the inverter is smaller than the preset allowable current level.

According to still another preferred aspect of the invention, the method according to the invention further comprises a step of filtering the detected output currents of the three phases using a low pass filter after detecting the three-phase output currents of the inverter.

According to still another preferred aspect of the invention, in the method according to the invention, the leg-shunt resistors are three leg-shunt resistors which are disposed at emitter terminals located at lower ends of Insulated-Gate Bipolar Transistors of the phases of the inverter, respectively.

According to still another preferred aspect of the invention, in the method according to the invention, the three-phase output currents of the inverter are calculated based upon detected voltages applied to the three leg-shunt resistors.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this disclosure, illustrate exemplary embodiments and together with the description serve to explain the principles of the invention.

In the drawings.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the disclosure, and the suffix itself is not intended to give any special meaning or function. In describing the present disclosure, moreover, the detailed description will be omitted when a specific description for publicly known technologies to which the invention pertains is judged to obscure the gist of the present disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

The present invention is described based on detailed embodiments, but it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

Figures 7, 8:
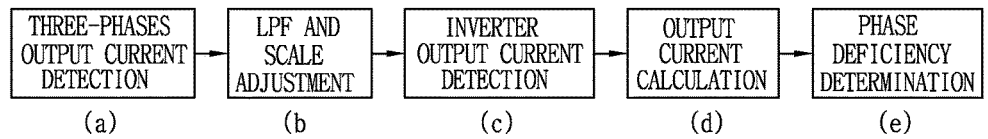
FIG. 7 is a table showing formulas for calculating output currents of an inverter according to the PWM states of the inverter illustrated in FIG. 6.
FIG. 8 is a block diagram illustrating sequential steps of detecting currents in an inverter.

FIG. 8 is a block diagram illustrating sequential steps of detecting currents in an inverter. Referring to FIG. 8, a current detection in an inverter may roughly be performed in sequential steps of (a) three-phases output current detection→(b) low pass filtering and scale adjustment for noise removal→(c) output current detection→(d) output current calculation→(e) phase deficiency determination. The present invention specifically relates to the step (c) of the output current detection of the inverter among the sequential steps, which will be described in detail, hereinafter.

Figure 1:
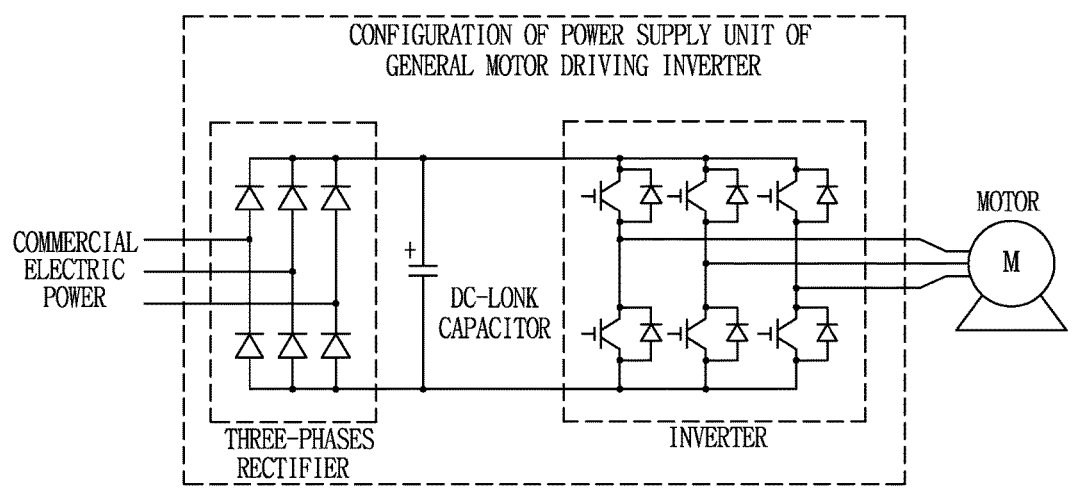
FIG. 1 is a configuration view of a power supply unit of a general motor-driving inverter.
Figure 2A:
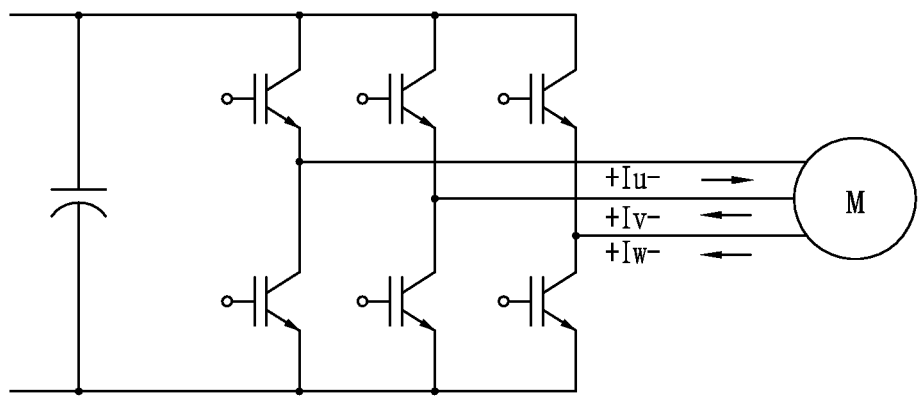
FIG. 2A is a view illustrating an output current path during a normal operation of an inverter.
Figure 2B:
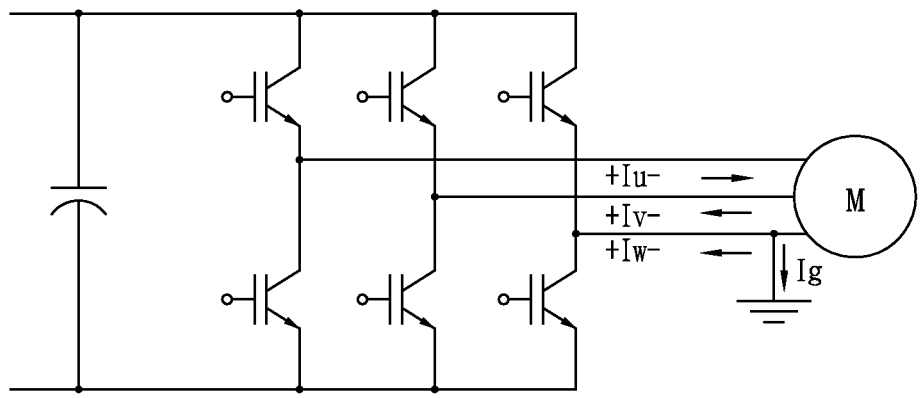
FIG. 2B is a view illustrating an output current path upon an occurrence of a ground fault in an inverter.
Figure 3:
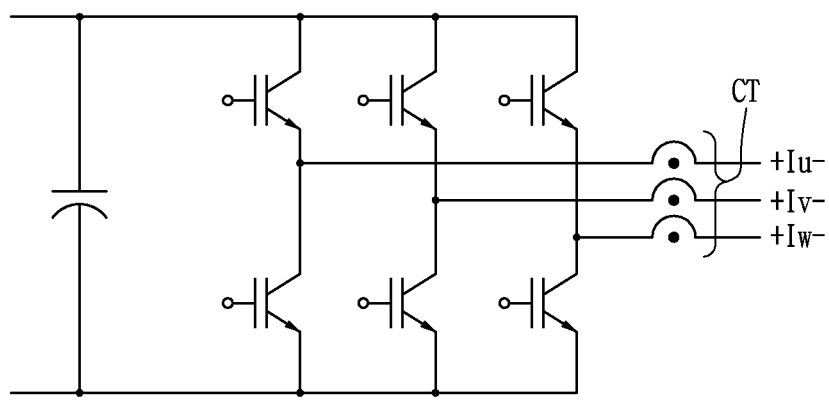
FIG. 3 is a view illustrating a current detection method using CTs.
Figure 4:
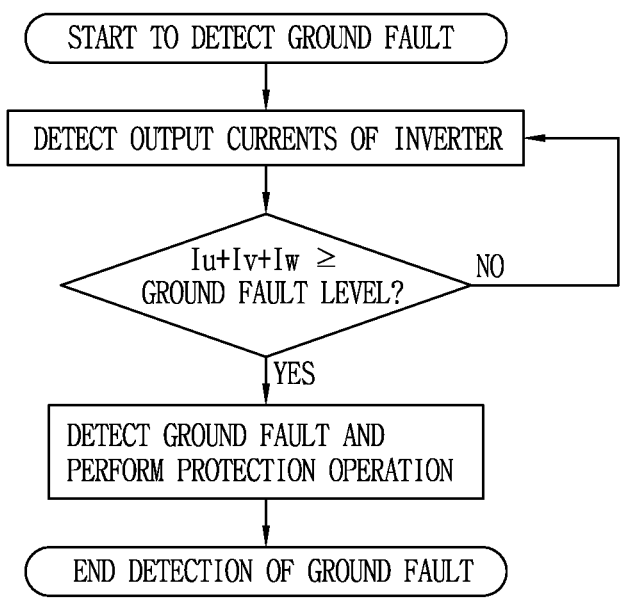
FIG. 4 is a flowchart illustrating a method for detecting a ground fault on an output line of an inverter according to the related art.
Figure 5:
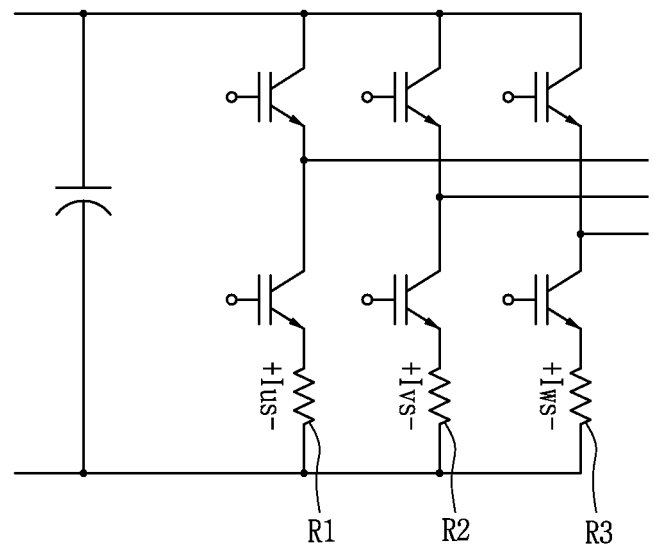
FIG. 5 is a view illustrating a current detection method using leg-shunt resistors.
Figure 9:
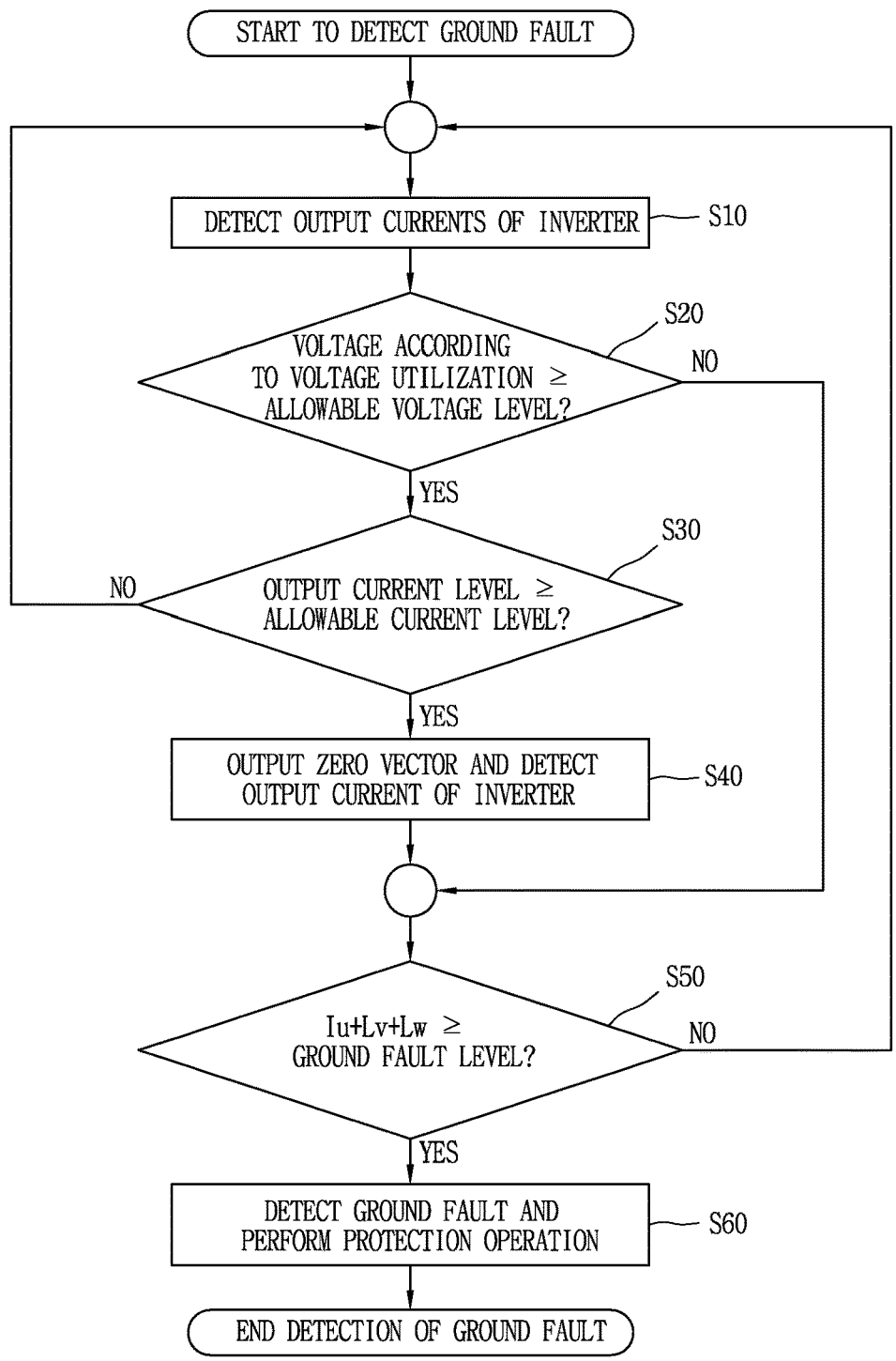
FIG. 9 is a flowchart illustrating a method for detecting a ground fault on an output line of an inverter in accordance with one exemplary embodiment of the present invention.

FIG. 9 is a flowchart illustrating a method for detecting a ground fault on an output line of an inverter in accordance with one exemplary embodiment of the present invention. Referring to FIG. 9, according to a method for detecting a ground current in an inverter, comprises a step that detects output currents Ius, Ivs and Iws of the inverter (S10). In this instance, the output currents Ius, Ivs and Iws refer to currents flowing on leg-shunt resistors (see R1, R2 and R3 in FIG. 5) which are connected with the emitter terminals of lower IGBTs for the phases of the inverter, respectively. The three-phase output currents Ius, Ivs and Iws may be calculated based upon detected voltages applied to the three leg-shunt resistors, respectively, or detected by use of current detectors such as current transformer.

Afterwards, it may be determined whether or not a voltage according to a voltage utilization of the inverter is not less than a preset allowable voltage level (S20). Here, the voltage utilization of the inverter can be a rate (%) of an output voltage of the inverter to a DC link voltage of the inverter. When a voltage according to the voltage utilization of the inverter is lower than the preset allowable voltage level (if the result of the determination is negative, that is "NO"), an occurrence or non-occurrence of a ground fault may be determined using the detected output currents Ius, Ivs and Iws of the inverter (S50). The determination as to whether the ground fault has occurred or not may be implemented (processed) by a microcomputer included in the inverter in a manner of determining whether or not the sum (Ius+Ivs+Iws) of the three-phases output currents of the inverter is not less than a preset ground fault level by applying the KCL to the detected output currents Ius, Ivs and Iws. Also, the inverter to which the method of detecting the ground fault in the inverter according to the present invention is applicable may further include a ground fault determining unit (not illustrated) configured by the microcomputer. The ground fault determining unit, as aforementioned, may determine the occurrence or non-occurrence of the ground fault in a manner of determining whether or not the sum (Ius+Ivs+Iws) of the three-phase output currents of the inverter is not less than the preset ground fault level by applying the KCL to the detected output currents Ius, Ivs and Iws.

When the sum of the three-phases output currents is not less than the preset ground fault level, the ground fault determining unit can determine that the ground fault has occurred, and thus a protection operation may be carried out (S60).

Meanwhile, when the voltage utilization is not less than the preset allowable voltage level in the step S20, it may be determined whether or not an output current level is not less than a preset allowable current level (S30). When the output current level of the inverter is lower than the preset allowable current level (if the result of the determination is negative, that is "NO"), the process may go back to an initial step and re-performed. When the output current level is not less than the preset allowable current level (if the result of the determination is positive, that is "YES), a zero vector may be applied to IGBTs of the inverter through a PWM, and output currents of the inverter may be sampled within a zero vector zone (S40). Afterwards, the occurrence or non-occurrence of the ground fault may be determined using the three-phase output currents Ius_zero, Ivs_zero and Iws_zero sampled within the zero vector zone (S50).

In detail, when a sum of the sampled three-phases output currents (Ius_zero+Ivs_zero+Iws_zero) within the zero vector zone is not less than the preset ground fault level value, it may be determined that the ground fault has occurred and thus the protection operation may be carried out (S60).

As aforementioned, in the method for detecting the ground fault in the inverter according to the present invention, the occurrence or non-occurrence of the ground fault may be determined using the sensed(detected) three-phases currents without a PWM process in a region where a sufficient zero vector zone is ensured by virtue of a low voltage utilization, whereas the ground fault can be detected in a manner of sensing the three-phases output currents in the zero vector zone through the PWM process when a sufficient zero vector zone is not ensured due to a high voltage utilization.

Hereinafter, description will be given in detail of a detection of output currents of an inverter within a zero vector zone, in the method of detecting the ground fault on the inverter according to the present invention, with reference to FIG. 10.

Figure 6:
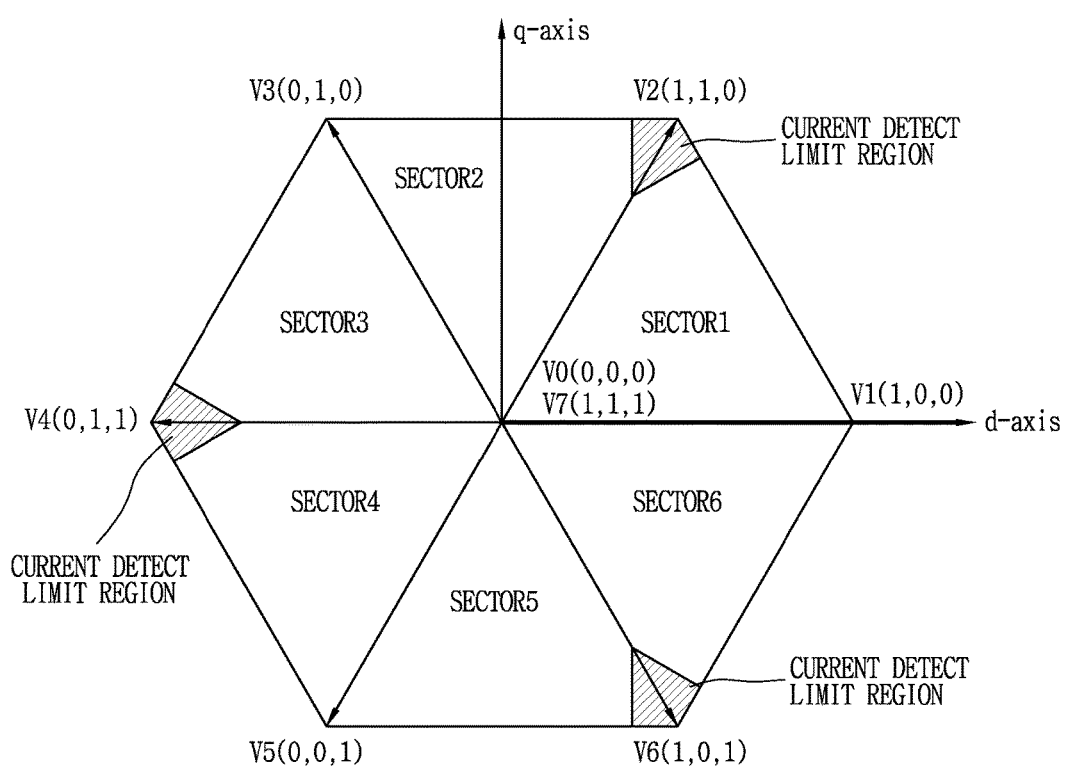
FIG. 6 is a view illustrating output current detection limit regions according to PWM states of an inverter.
Figure 10:
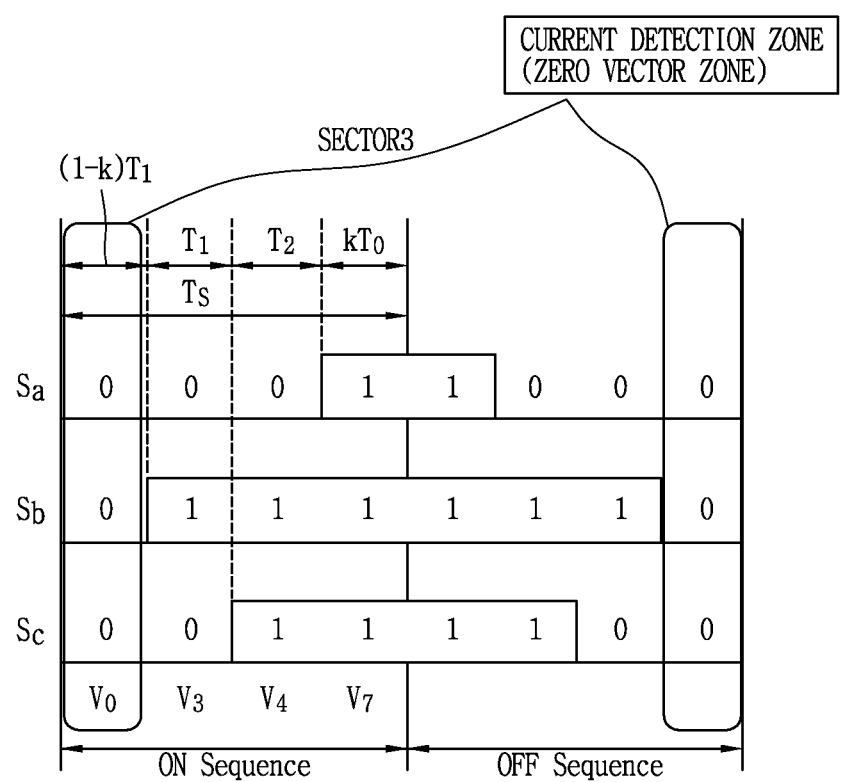
FIG. 10 is a view illustrating a method of sampling output currents of an inverter within a zero vector applying zone (sector) in the method of detecting the ground fault in the inverter according to the present invention.

FIG. 10 illustrates an example based on a sector 3 among six sectors of a vector PWM algorithm illustrated in FIG. 6. The zero vector zone refers to a zone in which three-phases PWM signals (pulses) for switching the IGBTs in the inverter are all logic "0". In the zero vector zone, three-phases output currents of the inverter can all be detected. Active regions in the sector 3 may be V3 {a region in which the logic level of PWM signals for the IGBTs (Sa, Sb, Sc) are 0, 1, 0} and V4 (a region in which the logic level of PWM signals for the IGBTs (Sa, Sb, Sc) are 0, 1, 1}, and zero vectors may be V0 {a region in which the logic level of PWM signals for the IGBTs (Sa, Sb, Sc) are 0, 0, 0} and V7 {a region in which the logic level of PWM signals for the IGBTs (Sa, Sb, Sc) are 1, 1, 1}. Since a vector which allows the current detection is V0 of the zero vectors, the current detection may be carried out in the V0 zone in the embodiment of the present invention. A physical time of the zero vector-applying zone may be determined based on the voltage utilization and a switching frequency of the inverter. The time of the zero vector-applying zone may be reduced when the voltage utilization and the switching frequency are high. Therefore, the current detection may be performed in the active vector zones V1 to V6. The detected output currents in the zero vector zone V0 may be sampled. The KCL may then be applied to the sampled output currents to determine whether or not the ground fault has occurred.

As aforementioned, the present invention may allow for detecting an occurrence or non-occurrence of a ground fault accurately and fast in a method of detecting currents using leg-shunt resistors which can be implemented with relatively lower costs than a current detection method using Current Transformers.

According to the method of detecting the ground fault in the inverter disclosed herein, the ground fault occurred on the inverter can be detected in the current detecting method using the leg-shunt resistors.

Also, according to the present invention, the accurate and fast detection of the ground fault occurred on the inverter can be executed in the current detection using the leg-shunt resistors, fabrication and maintenance costs of the inverter can be reduced, and also a low-priced small inverter can be actively spread.

The foregoing embodiments of the present invention are merely illustrative, and it will be understood by those skilled in the art that many variations and equivalents can be derived from those embodiments. Therefore, the technical scope of the present invention should be defined in the appended claims.

What is claimed is:

1. A method for detecting a ground fault on an output line of an inverter, the method comprising:
    detecting output currents for three phases of the inverter by using shunt resistors of the inverter;
    determining a voltage according to a voltage utilization of the inverter;
    comparing the determined voltage to an allowable voltage level; and
    determining occurrence of the ground fault based on the detected output currents and the comparison of the determined voltage to the allowable voltage level.

2. The method of claim 1, wherein determining the occurrence of the ground fault comprises:
    determining that the determined voltage is not less than the allowable voltage level; and
    determining whether a sum of the detected output currents is less than a first allowable current level.

3. The method of claim 2, further comprising:
    applying a zero vector via pulse-width modulation; and
    sampling the output currents within a zero vector zone when it is determined that the sum of the detected output currents is not less than the first allowable current level.

4. The method of claim 3, further comprising determining occurrence of the ground fault using the sampled output currents.

5. The method of claim 4, further comprising determining that the ground fault has occurred and executing a protection operation when a sum of the sampled output currents is not less than a second allowable current level.

6. The method of claim 1, further comprising determining occurrence of the ground fault and executing a protection operation when the determined voltage is lower than the voltage threshold and a sum of the detected output currents is not less than a current level.

7. The method of claim 2, further comprising again detecting the output currents for the three phases when it is determined that the sum of the detected output current is smaller than the first allowable current level.

8. The method of claim 1, further comprising filtering the detected output currents using a low pass filter.

9. The method of claim 1, wherein detecting the output currents comprises measuring current across a leg-shunt resistor connected to each of three emitter terminals of lower Insulated-Gate Bipolar Transistors of the phases of the inverter.

10. The method of claim 9, wherein the output currents are calculated based upon detected voltages applied to the leg-shunt resistors.

* * * * *